United States Patent [19]

Klink et al.

[11] Patent Number: 5,227,995
[45] Date of Patent: Jul. 13, 1993

[54] HIGH DENSITY SEMICONDUCTOR MEMORY MODULE USING SPLIT FINGER LEAD FRAME

[75] Inventors: Erich Klink, Schoenaich; Helmut Kohler, Moensheim; Harald Pross, Wildberg, all of Fed. Rep. of Germany

[73] Assignee: International Business Machines Corporation, Armonk, N.Y.

[21] Appl. No.: 554,635

[22] Filed: Jul. 17, 1990

[30] Foreign Application Priority Data

Jul. 18, 1989 [EP] European Pat. Off. ......... 89113119

[51] Int. Cl.⁵ ............... G11C 5/06; H01L 23/495; H01L 23/50; H05K 5/02
[52] U.S. Cl. ..................... 365/63; 257/666; 257/670; 257/676; 361/421
[58] Field of Search ............ 365/51, 52, 63; 357/69, 357/70, 71, 74, 75, 81; 361/386, 389, 392, 403, 404, 407, 408, 413, 421; 257/666, 670, 672, 676

[56] References Cited

U.S. PATENT DOCUMENTS

| | | | |
|---|---|---|---|
| 4,214,120 | 7/1980 | Jones, Jr. et al. | 257/676 X |
| 4,363,076 | 12/1982 | McIver | 361/403 |
| 4,423,468 | 12/1983 | Gatto et al. | 361/404 |
| 4,496,965 | 1/1985 | Orcutt et al. | 257/666 |
| 4,514,750 | 4/1985 | Adams | 257/670 |
| 4,521,828 | 6/1985 | Fanning | 361/421 |
| 4,763,188 | 8/1988 | Johnson | 361/421 |
| 4,766,478 | 8/1988 | Dennis | 257/666 |
| 4,774,635 | 9/1988 | Greenberg et al. | 361/404 |
| 4,862,245 | 8/1989 | Pashby et al. | 257/660 |
| 4,862,322 | 8/1989 | Bickford et al. | 361/413 |
| 4,884,237 | 11/1989 | Mueller et al. | 365/63 |
| 4,942,455 | 7/1990 | Shinohara | 257/666 |
| 4,965,654 | 10/1990 | Karner et al. | 257/676 |
| 4,979,016 | 12/1990 | Lee | 257/676 X |
| 4,982,265 | 1/1991 | Watanabe et al. | 257/777 X |
| 4,987,473 | 1/1991 | Johnson | 257/676 |
| 4,996,583 | 2/1991 | Hatada | 257/692 |
| 5,012,323 | 4/1991 | Farnworth | 361/421 |
| 5,052,481 | 10/1991 | Horvath et al. | 361/386 |

FOREIGN PATENT DOCUMENTS 56-137665 10/1981 Japan .

*Primary Examiner*—Joseph L. Dixon
*Assistant Examiner*—Michael A. Whitfield
*Attorney, Agent, or Firm*—Francis J. Thornton

[57] ABSTRACT

The semiconductor memory module comprises a housing of plastic or ceramic in which two chips are stacked together back-to-back. The pads of the chips are electrically connected by wire bonding to beam leads which comprise outer bond leads, generally arranged outside the housing to form the contact pins or contact leads of the module to a printed circuit board, and inner bond leads in the housing. The inner bond leads are split and spread in the area of the inner lead bond ends into upper and lower sets forming a gap for receiving and holding the stacked chips.

7 Claims, 4 Drawing Sheets

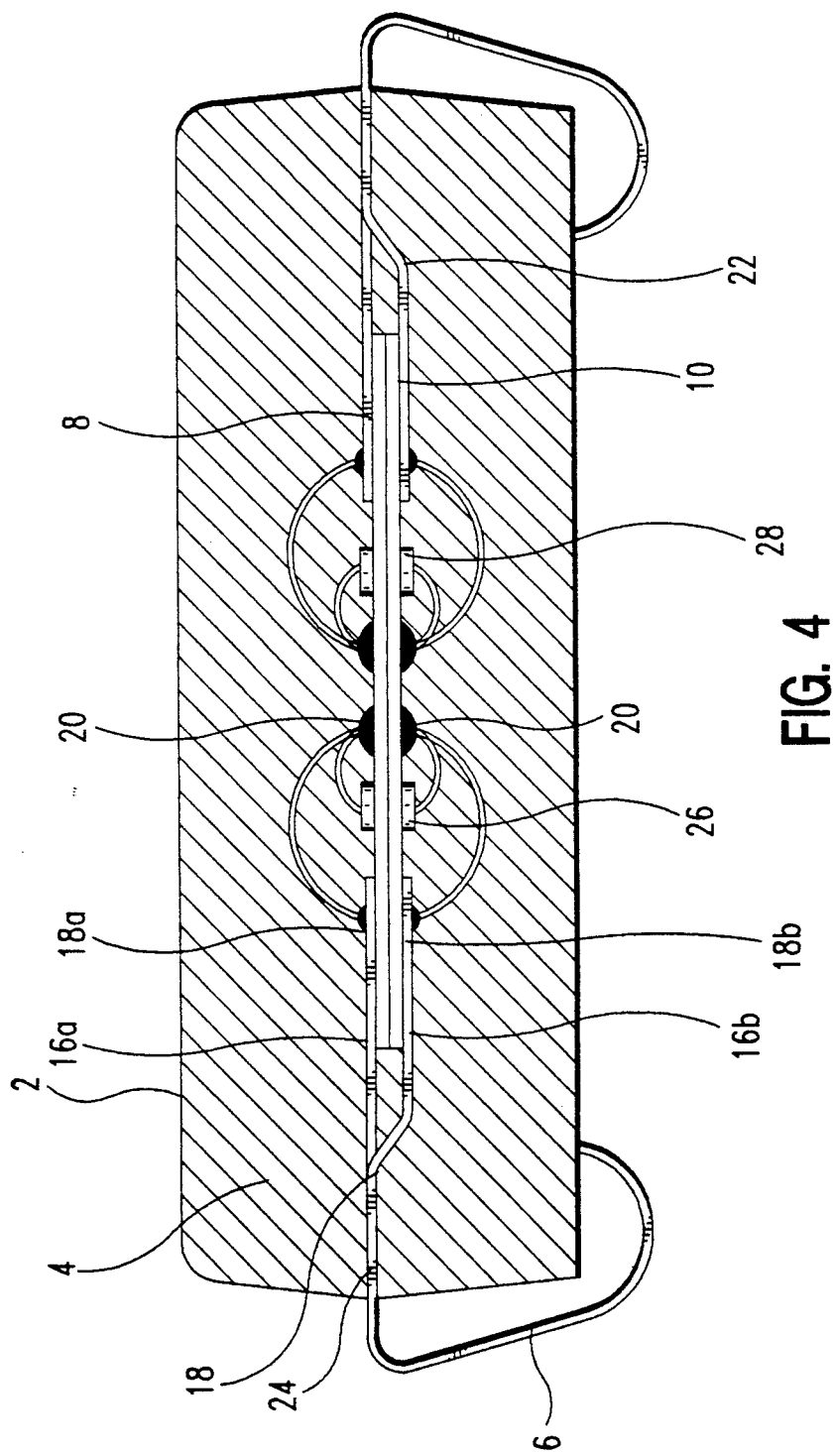

HIGH DENSITY SEMICONDUCTOR MEMORY MODULE USING SPLIT FINGER LEAD FRAME

BACKGROUND OF THE INVENTION

1. Field of the Invention

The present invention relates to high density semiconductor memory modules, and more particularly to a method of forming a multi-chip semiconductor memory module, and to the multi-chip semiconductor memory module so formed.

2. Prior Art

A substantial part of the cost of manufacturing computer systems directly depends upon the space occupied by the integrated circuit chips used to fabricate the systems. Thus it is important to minimize the size of semiconductor memory modules.

One structure to increase the chip density is formed by mounting or stacking chips on one another. Prior art, e.g., U.S. Pat. No. 4,423,468 shows examples of dual stacked chips to form a double-chip structure in which both chips are bonded to a single substrate. The active faces are directed away from each other to permit easy electrical connection to the exposed input/output (I/O) terminals on each chip.

JP-A-56-137665 describes a dual inline package module (DIP) containing two pairs of semiconductor chips, each chip having solder mounds on its active face for electrical connection to the circuits within the chips. The active faces of the chips of one pair are mounted facing each other with solder mounds on one chip aligned with corresponding solder mounds of the other chip. The two pairs are stacked by facing the back of the upper chip of the first pair with the back of the lower chip of the second pair.

SUMMARY OF THE INVENTION

This invention provides a double density memory module. In particular, the present invention uses a so-called dual inline plastic or DIP module in which the chips inside the molded plastic housing are connected to a single lead frame having a plurality of conductive members whose inner ends are split to form two sets of inner bond leads, each bonded to a respective chip, and whose outer ends form the contact pins.

Each set of inner bond leads is bent in an appropriate direction to obtain a sufficient gap for insertion of a pair of back-to-back chips between the two sets. The chips stacked back-to-back are positioned in the gap formed by the divergence of the inner bond leads so that the inner bond leads embrace the back-to-back chips. The chips can be identical or mirrored. In the first case the respective inner lead bond ends and the chip pads have to be selectively bonded, e.g. by wire bonding, to form the appropriate connectors. In the second case the inner lead bond ends can be bonded directly to the respective chip pads. In this case the chips may be shifted relative to each other for adjusting the chip pads to the respective inner bond leads and for compensating the displacement of the upper inner bond leads and the lower inner bond leads.

The handling of the module after fixing the chips to the bond leads corresponds to the common methods for the manufacturing of memory DIP modules.

This invention reduces the height of the module containing such dual chips close to the range of the present single chip modules which leads to a reduction of manufacturing costs.

For better understanding of the present invention, together with further objects, advantages and features thereof, a preferred embodiment of the invention is described in the following with reference to the accompanying drawings, in which:

DESCRIPTION OF THE DRAWINGS

FIG. 4 is a cross-sectional view of a double-chip module employing the present invention.

DETAILED DESCRIPTION OF THE INVENTION

Figure 1:
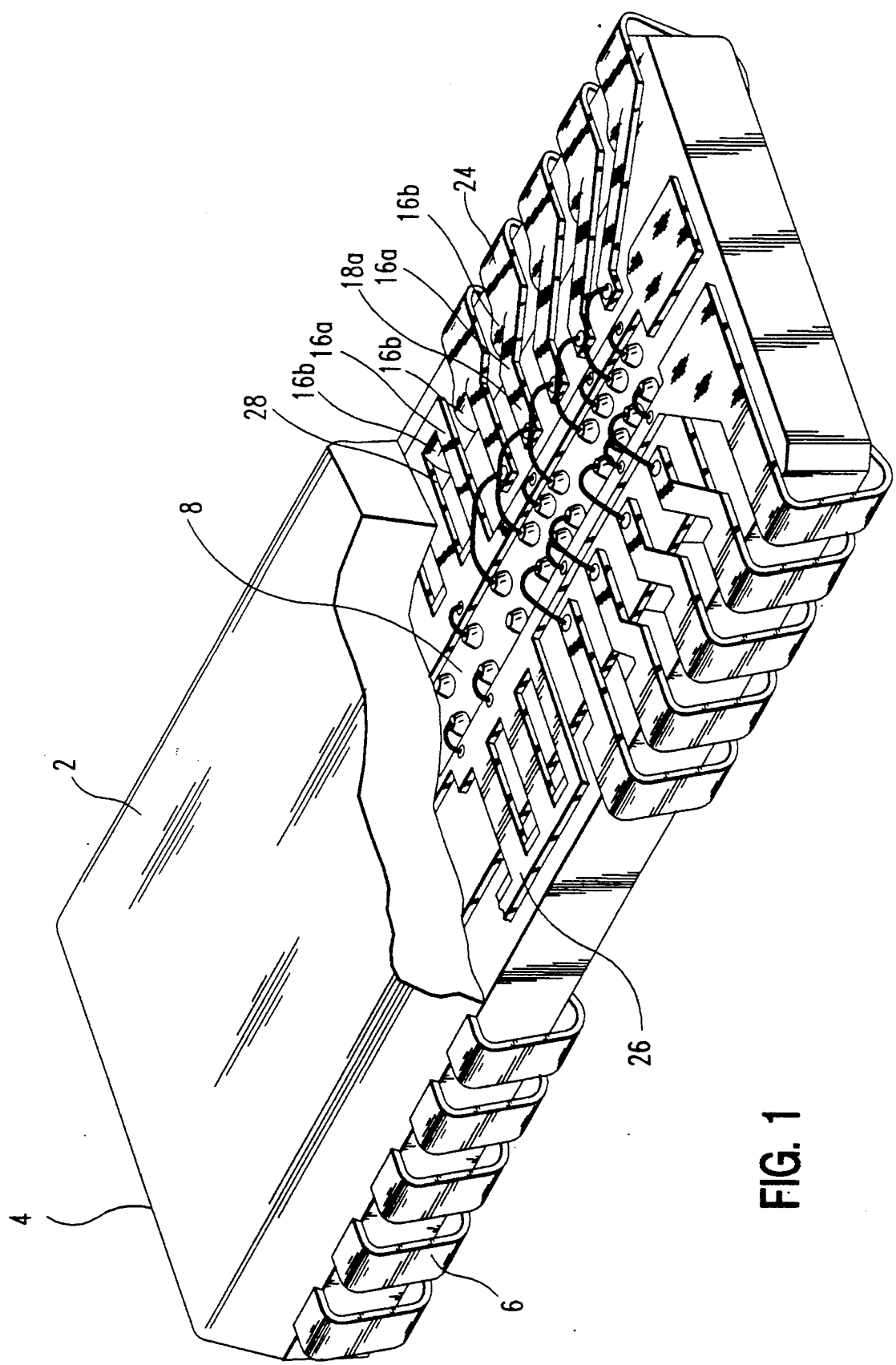
FIG. 1 is a partially broken away view of a dual inline package module containing the present invention.

In the figures there is shown a semiconductor memory module 2 of the DIP type containing the present invention. The module comprises a plastic housing 4, a pair of back-to-back bonded semiconductor chips 8 and 10, and a lead frame 14 having inner leads 16 and outer leads 6. These outer leads 6 usually extend from both sides of the housing 4 and may be formed as, for example as shown as J-leads for surface mounting of the memory module on a printed circuit board (not shown). A more detailed description of a semiconductor device which has the inner position of the leads of the lead frame insulatively overlying the active force of a semiconductor is to be found in U.S. Pat. No. 4,862,245 which is assigned to the same assignee as the present invention. Part of the top portion of the housing is broken away and shows the top chip 8. Selected pads 20 on the face of each of the chips 8 and 18 are wire bonded to the ends of respective inner bond leads 16. Power supply leads 26 and ground supply leads 28 also bonded to respective pads 20 are also shown.

Figure 3:
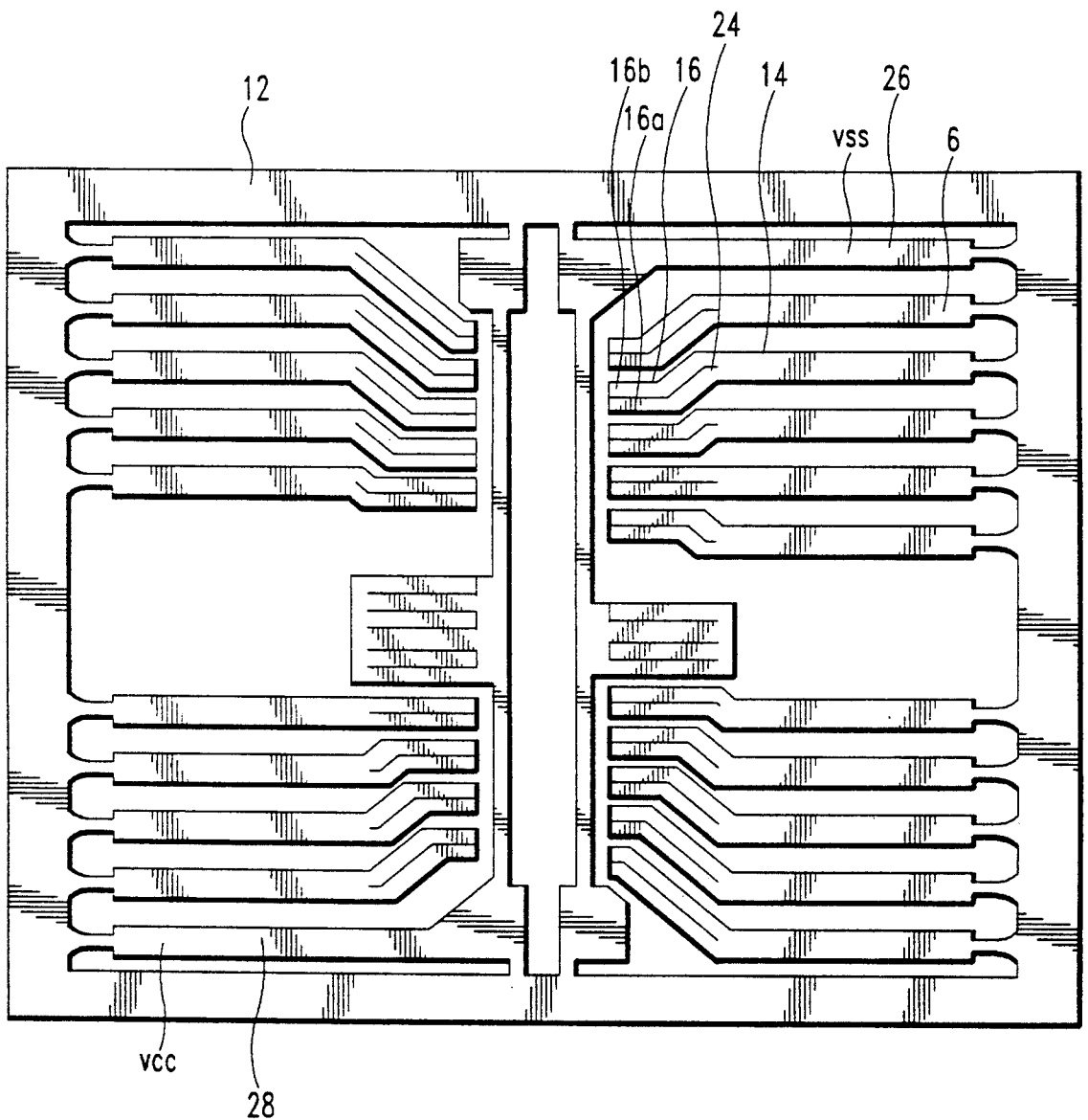
FIG. 3 is a top view of a lead frame having split divergent inner bond leads in accordance with the present invention.

A lead frame 24 formed in a manner well known to those skilled in the art is shown in detail in FIG. 3. This lead frame 14 is provided with a selvedge 12 to support the individual leads while in their initial position. During formation of the lead frame inner portions of each lead is split, for example, by stamping, into two equal but divergent sections 16a and 16b. As shown in FIG. 4, portions 16a and 16b are formed by the same stamping operation so that the portion 16b diverges from the portion 16a, yet results in the arrangement wherein the end section 18a of the portion 16a will lie parallel to the pad bearing surface of the top chip 8 and the end section 18b of the portion 16b lies parallel to the pad bearing surface of the underlying chip 10. Wire bonds can then be made between the pads 20 on each of the chips 8 and 10, to respective end section 18a or 18b as required. To access the respective chips selected ones of the leads must be respectively coupled exclusively to each of the chips so that it can be used as a chip select device input lead. Thus, one of the leads is exclusively coupled to the upper chip 8 and another is exclusively coupled to the lower chip 10.

Figure 2:
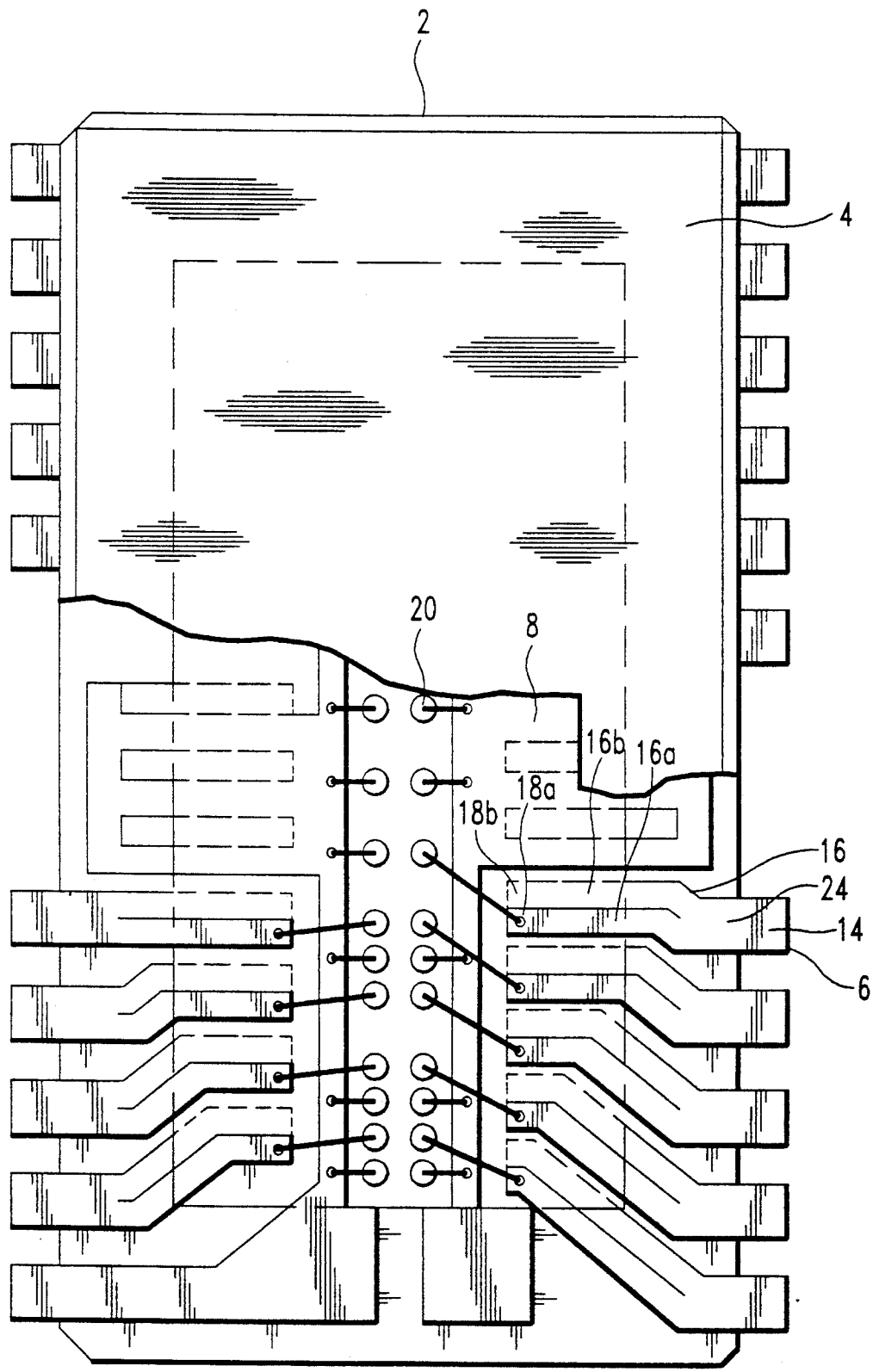
FIG. 2 is a top view of FIG. 1.

FIG. 2 is a top view of FIG. 1. The split diverted end section 18b of the leads connecting to the bottom chip are depicted with broken lines and show how the lower section 18b also overlie the surface of the lower chip 10.

Once the lead frame has been treated to form the divergent split ends of the leads the chips 8 and 10, previously bonded back-to-back by any convenient operation such as by using solder or an epoxy or other adhesive, and coated with an insulating layer in the region under the lead end 18a and 18b as taught in U.S. Pat. No. 4,862,245, are inserted between the divergent ends 18a and 18b.

The inner bond lead ends 18a and 18b of the respective upper and lower bond leads are then wire bonded to respective chip pads 20 in a manner well known to the prior art. Following the wire bonding the entire unit is encapsulated in a plastic encapsulant as known to the prior art.

The lead frame selvedge 12 usually serves for positioning the beam leads and the chips and will be removed just prior to the forming of the J-leads in a further punching and bonding step.

In summary, the memory module of the preferred embodiment as shown in the drawings is manufactured in accordance with the inventive method as described above. Thus the inner bond leads 16 are slotted, or split at least in the area of the inner bond lead ends 18 after or during the lead frame formation step. Subsequent to the slotting step the slotted ends are spread to form a gap 22 in which the stacked chips 8 and 10 are inserted after having been glued together back-to-back. Then respective ends 18a and 18b are wire bonded to respective chip pads 20. After this wire bonding the unit is tested, encapsulated with a suitable molding compound and the selvedge 12 removed and the external lead ends 6 extending from the encapsulant formed into the desired shape.

Both memory chips should be accessed exclusively by separate chip select pins and all other pins like data lines, address lines, etc. can be commonly used by the top chip and the bottom chip.

We claim:

1. A method for forming high density semiconductor modules comprising the following steps:
    selecting a pair of semiconductor chips having major active surfaces and parallel major inactive surfaces, said major active surfaces having device input and output pads thereon,
    joining the major inactive surfaces of said chips back-to-back to form a stack having the major active surfaces and the pads thereon facing outwards from said stack,
    forming a lead frame with a spaced series of leads having inner ends and outer ends,
    splitting the inner ends of the leads to form split inner ends,
    forming the split inner ends of the leads into divergent upper and lower sets with a space therebetween,
    inserting said stack into the space between the sets so that the major active surface of each chip in said stack is adjacent to a respective one of said sets,
    joining said inner ends to said adjacent major active surface with an insulative adhesive,
    connecting the pads on one of said chips in said stack to said upper set of ends and the pads on the other of said chips in said stack to the lower set of ends with bonding wires to form a wire bonded chip stack,
    encapsulating said wire bonded chip stack with encapsulating so selected ones of leads have their outer ends extending out of said encapsulation,
    forming the outer ends of said leads extending out of said encapsulation.

2. The method as claimed in claim 1 further comprising the step of offsetting one of said chips relative to the other of said chips during said joining step.

3. The method as claimed in claim 1 wherein the pads of said chips are bonded to the respective ends of said leads by wire bonding.

4. A semiconductor module comprising:
    a housing,
    two chips having a plurality of pads thereon stacked together back-to-back in said housing to form a stack,
    leads electrically connected to the pads of said stacked chips by wire bonding, which leads have outer end substantially outside said housing and inner ends in said housing, which inner ends are formed into upper and lower sets having a gap therebetween for receiving said stack.

5. A metallic lead frame for the mounting of and interconnection to a semiconductor chip comprising:
    a hollow rectangular selvedge,
    a plurality of inwardly directed lead frame fingers within the periphery of said selvedge,
    a selected number of said fingers being supported at both ends, and
    the remainder of said fingers having free unsupported ends,
    each said selected number of said fingers having first and second sections, the second section being at an angle to the first section of said finger and traversing the unsupported ends of a portion of the remainder of said fingers, said first and second sections being respectively connected to a respective adjacent sides of said rectangular selvedge, and
    the unsupported ends of the remainder of said fingers being split and the second section of said lead frame, traversing the unsupported ends of said remainder of said fingers, being provided with a plurality of short fingers.

6. The lead frame of claim 5 wherein the second section of said lead frame traversing the unsupported ends of said other lead frame fingers is connected to said selvedge at two points.

7. The lead frame of claim 5 wherein the second section of said lead frame finger that traverses the unsupported ends of the other lead frame fingers is connected to opposing sides of said selvedge.

* * * * *